United States Patent [19]
Malladi et al.

[11] Patent Number: 5,831,333
[45] Date of Patent: Nov. 3, 1998

[54] INTEGRATED JUNCTION TEMPERATURE SENSOR/PACKAGE DESIGN AND METHOD OF IMPLEMENTING SAME

[75] Inventors: Deviprasad Malladi, Campbell; Douglas W. Forehand, Mountain View, both of Calif.

[73] Assignee: Sun Microsystems, Inc., Palo Alto, Calif.

[21] Appl. No.: 645,998

[22] Filed: May 14, 1996

[51] Int. Cl.⁶ .................................................. H01L 23/34
[52] U.S. Cl. .......................... 257/712; 257/713; 257/467; 361/719; 165/80.2
[58] Field of Search ................................. 257/712, 713, 257/467; 361/717, 718, 719; 165/80.2

[56] References Cited

U.S. PATENT DOCUMENTS

| | | | |
|---|---|---|---|
| 4,812,733 | 3/1989 | Tobey | 323/285 |
| 4,926,227 | 5/1990 | Jensen | 357/28 |
| 4,975,766 | 12/1990 | Umezawa | 357/81 |
| 4,982,274 | 1/1991 | Murase et al. | 357/82 |
| 5,361,188 | 11/1994 | Kondou et al. | 361/695 |
| 5,440,520 | 8/1995 | Schutz et al. | 365/226 |
| 5,483,102 | 1/1996 | Neal et al. | 257/713 |
| 5,569,950 | 10/1996 | Lewis et al. | 257/712 |

*Primary Examiner*—David Ostrowski
*Attorney, Agent, or Firm*—Forrest Gunnison

[57] ABSTRACT

A structure and method for controlling the junction temperature of a semiconductor chip in an electronic system. A temperature sensing device and the chip whose junction temperature is to be monitored are located adjacent to one another on the same interconnect structure. A thermally conductive lid can also be attached to the interconnect structure, thereby enclosing the temperature sensing device and the chip within in a closed cavity. Dedicated pins extend from the temperature sensing device through the interconnect structure, for connection to a temperature control circuit. By locating the temperature sensing device on the same interconnect structure as the chip, and within a common enclosure, the temperature sensed by the temperature sensing device is an accurate representation of the actual junction temperature of the chip. By obtaining an improved reading of the actual junction temperature, the operation of the temperature control circuit can be optimized.

23 Claims, 2 Drawing Sheets

INTEGRATED JUNCTION TEMPERATURE SENSOR/PACKAGE DESIGN AND METHOD OF IMPLEMENTING SAME

FIELD OF THE INVENTION

The present invention relates to a structure and method for maintaining the junction temperature of a semiconductor circuit chip at an acceptable level during normal operation of the chip.

BACKGROUND OF THE INVENTION

Integrated circuitry fabricated on semiconductor chips generates heat during normal operation. If the heat generated becomes excessive, the integrated circuitry can be damaged. Junction temperature is defined as the temperature of a semiconductor junction of the chip. The maximum junction temperature is a parameter which is typically specified for integrated circuits. Heat sinks and heat spreaders have been coupled to integrated circuits in an attempt to reduce the junction temperatures of the integrated circuits during normal operation. However, such heat sinks and heat spreaders can be insufficient to reduce the junction temperature to an acceptable level.

Certain electronic systems which include one or more integrated circuits have therefore provided a fan which increases the ambient air flow over the integrated circuits, thereby reducing the junction temperature of these integrated circuits. However, the fan undesirably wastes power and introduces noise to the environment. The fan typically cannot be continuously operated at a high speed during normal system operating conditions because of limitations on the amount of noise which can be present in the system. It is therefore desirable to have a fan which operates at high speed only when relatively high junction temperatures exist. To achieve such operation, prior art systems have used a temperature sensing device, such as a thermistor, to monitor the ambient temperature at a particular location in the electronic system. When the monitored ambient temperature exceeds a predetermined level, the temperature sensing device causes the fan to turn on.

In some prior art electronic systems, the temperature sensing device is positioned near the system power supply. In this system, the temperature sensing device is positioned relatively far from the integrated circuit to be cooled by the fan. If the temperature at the power supply does not accurately represent the junction temperature of the integrated circuit to be cooled, the operation of the fan is sub-optimal.

FIG. 1 is a cross sectional view of another conventional fan-cooled electronic system 100. Electronic system 100 includes packaged integrated circuit 1, temperature sensing device 106, multi-layer printed circuit board 130 (which includes electrically conductive traces 131 and 132), fan control circuit 140 and fan 141. Packaged integrated circuit 1 includes semiconductor chip 101, chip solder ball array 102, underfill 103, thermally conductive lid 104, heat sink connector 105, voltage supply capacitors 107a–107b, adhesive 108, thermally conductive adhesive 109, multi-layer interconnect structure 110, voltage supply lines 111a–111d, heat sink 116, and package solder ball array 120.

In system 100, temperature sensing device 106 is located on the upper surface of printed circuit board 130. Most of the heat generated by chip 101 which reaches temperature sensing device 106 follows a thermal path through interconnect structure 110 and the air gap 121 between interconnect structure 110 and temperature sensing device 106. This is a relatively high thermal resistance path. As a result, the temperature detected by temperature sensing device 106 may not accurately represent the junction temperature of chip 101. In addition, junction temperature variations may not be accurately transmitted to temperature sensing device 106.

It would therefore be desirable to have an integrated circuit system which more accurately detects the junction temperature of a chip in an electronic system. It would also be desirable if such a system did not have increased layout area or cost when compared with existing electronic systems.

SUMMARY

Accordingly, the present invention provides an integrated circuit having a temperature sensing device located on the same interconnect structure as the semiconductor chip whose junction temperature is to be monitored. Dedicated pins extend from the temperature sensing device through the interconnect structure, for connection to a temperature control circuit. In a particular embodiment, a lid is attached to the interconnect structure, thereby enclosing the temperature sensing device and the chip within in a closed cavity.

The temperature sensing device can replace a power supply capacitor on the interconnect structure, so that the layout area of the system remains unchanged. Alternatively, the temperature sensing device can be located at a dedicated location on the interconnect structure.

By locating the temperature sensing device on the same interconnect structure as the chip, the thermal resistance of the path between the temperature sensing device and the chip is minimized. The thermal resistance of this path is further reduced if the temperature sensing device and the chip are located in an enclosed cavity. As a result, the temperature sensed by the temperature sensing device is an accurate representation of the actual junction temperature of the chip. By obtaining an improved reading of the actual junction temperature, the operation of the temperature controller can be optimized.

The present invention will be more fully understood in light of the following detailed description taken together with the drawings.

DETAILED DESCRIPTION

The present specification defines certain elements as being "thermally conductive." As defined herein, the term "thermally conductive" refers to materials having a thermal conductivity on the order of 1 Watt/Meter-°Kelvin or greater.

Figure 1:
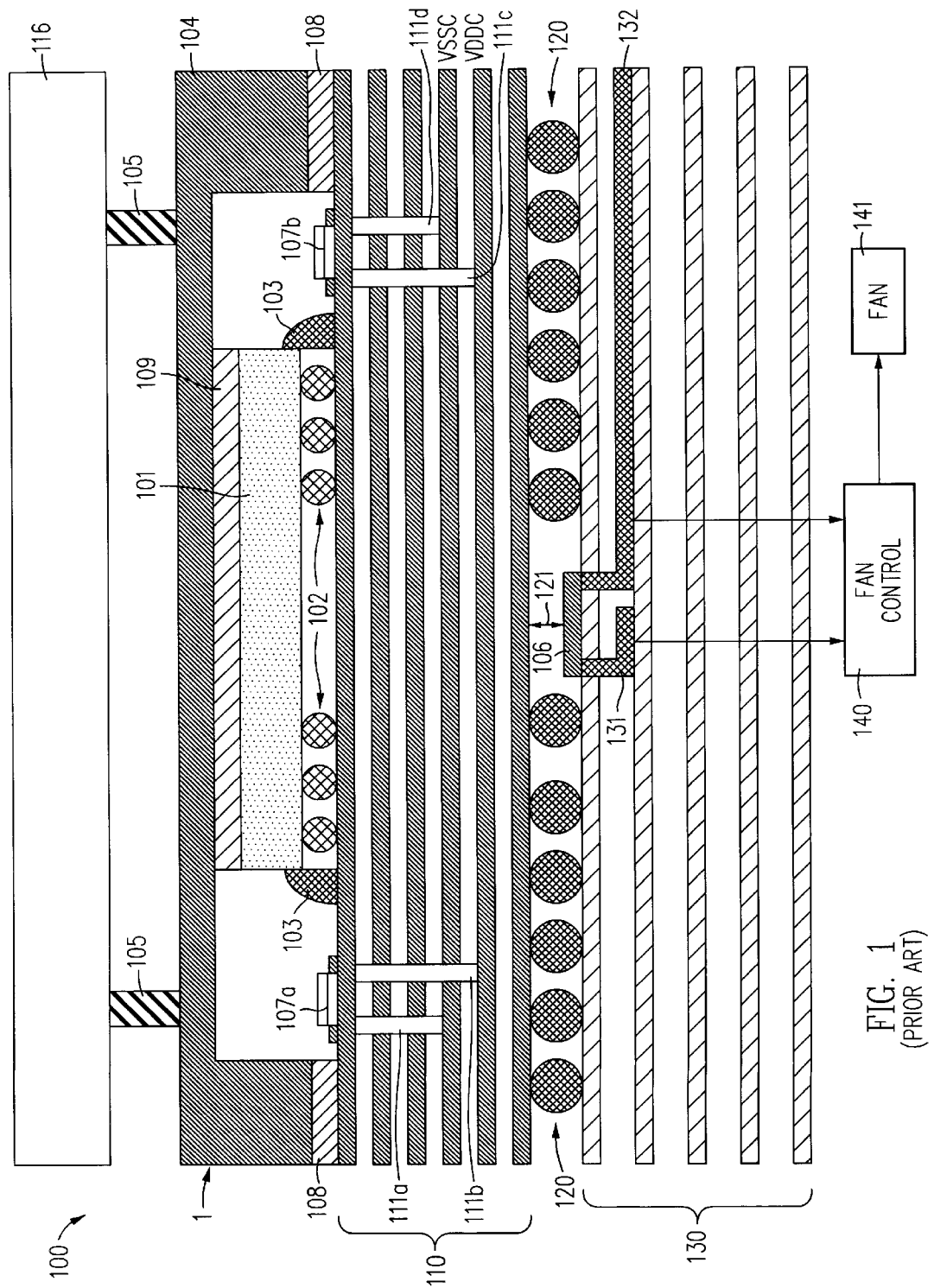
FIG. 1 is a cross sectional and schematic view of a convention electronic system.
Figure 2:
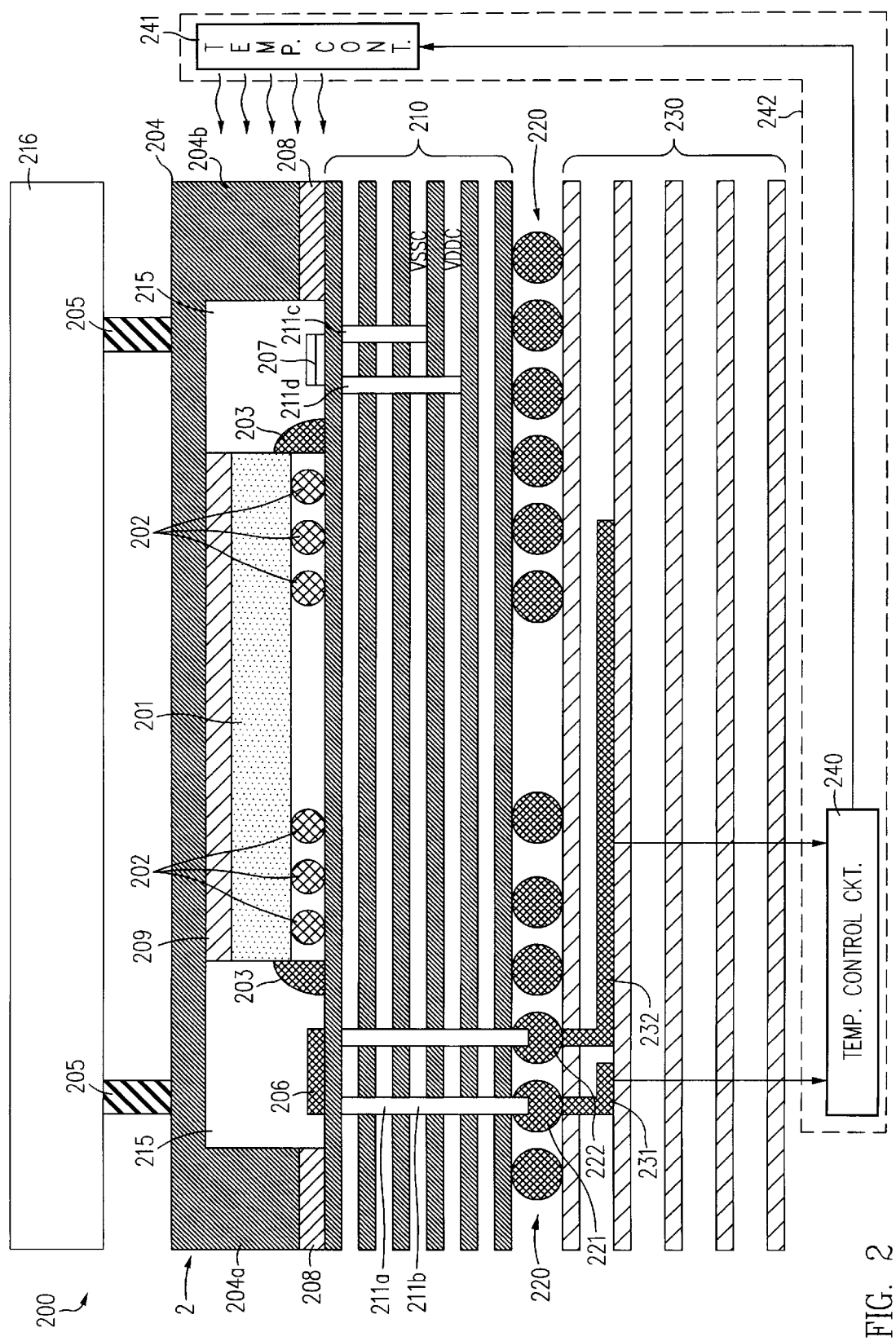
FIG. 2 is a cross sectional and schematic view of an electronic stem in accordance with one embodiment of the invention.

FIG. 2 is a cross sectional and schematic diagram of an electronic system 200 in accordance with one embodiment of the invention. System 200 includes packaged integrated circuit 2, multi-layer printed circuit board 230 and cooling component 242. Packaged integrated circuit 2 includes semiconductor chip 201, chip solder ball array 202, underfill 203, thermally conductive lid 204, heat sink mounting element 205, temperature sensing device 206, power supply capacitor 207, adhesive 208, thermally conductive adhesive 209, multi-layer interconnect structure 210, electrically conductive interconnect pins 211a–211d, enclosure 215, eat sink 216, and package solder ball array 220 (including individual solder balls 221 and 222). cooling component 242 includes temperature control circuit 240 and temperature controller 241.

In the described embodiment, chip 201 mounted in a conventional flip chip configuration which includes integrated circuitry fabricated on a monocrystalline silicon substrate. The integrated circuitry on chip 201 is electrically connected to chip solder ball array 202 by a multi-layer interconnect structure (not shown) which is fabricated over the silicon substrate in accordance with conventional semiconductor processing techniques. Chip solder ball array 202 is also connected to electrically conductive traces (not shown) which are located on the upper surface of interconnect structure 210.

Interconnect structure 210 includes alternating layers of electrically insulating material and electrically conductive traces which are connected in a manner known in the art, thereby providing conductive pathways from the upper surface of interconnect structure 210 to the lower surface of interconnect structure 210. In a particular embodiment, the conductive layers of interconnect structure 210 are copper and the insulating layers are made of conventional fire retardant resin-glass cloth laminate (designated FR-4 by the Electronic Industries Association). In another embodiment, interconnect structure 210 includes alternating layers of copper and insulating polyimide.

Underfill 203, which is typically a material such as epoxy resin, is located around the perimeter of chip 201. Underfill 203 joins chip 201 to interconnect structure 210 and adds rigidity and planarity to interconnect structure 210. Underfill 203 is typically selected to have a coefficient of thermal expansion similar to that of interconnect structure 210.

Temperature sensing device 206 and voltage supply capacitor 207 are attached to the upper surface of interconnect structure 210, outside the outer perimeter of underfill 203. Temperature sensing device 206 is, for example, a thermistor or a temperature sensitive diode. Voltage supply capacitor 207 is typically a ceramic or thin film capacitor which is connected between the $V_{DD}$ and $V_{SS}$ voltage supply rails to provide improved power supply operating characteristics. Dedicated electrically conductive pins 211a and 211b extend through interconnect structure 210 and connect temperature sensing device 206 to respective solder balls 221 and 222 of package solder ball array 220 at the lower surface of interconnect structure 210. Similarly, dedicated electrically conductive pins 211c and 211d extend through interconnect structure 210 to connect voltage supply capacitor 207 to the $V_{DD}$ and $V_{SS}$ voltage supply rails within interconnect structure 210. There are typically a plurality of voltage supply capacitors, similar to voltage supply capacitor 207, located on the upper surface of interconnect structure 210 around the outer perimeter of underfill 203. In a particular embodiment of the present invention, temperature sensing device 206 is located at a position which would have previously been dedicated for one of these voltage supply capacitors. In another embodiment, temperature sensing device 206 is located at a dedicated position on the upper surface of interconnect structure 210.

As previously described, the conductive layers of interconnect structure 210 extend to the lower surface of interconnect structure 210. The solder balls of package solder ball array 220 provide electrically conductive paths between the conductive traces on the lower surface of interconnect structure 210 and conductive traces located on the upper surface of multi-layer printed circuit board 230. For example, solder balls 221 and 222 are connected to conductive pins 211a and 211b, respectively at the bottom surface of interconnect structure 210. Solder balls 211 and 222 further provide electrical connections to respective electrically conductive traces 231 and 232 of printed circuit board 230. Conductive traces 231 and 232 in turn provide electrically conductive pathways to temperature control circuit 240. Although temperature control circuit 240 is shown schematically in FIG. 2 as being located off of printed circuit board 230, it is understood that temperature control circuit 240 can be mounted on a separate portion of printed circuit board 230 which is not illustrated in FIG. 2. Temperature control circuit 240 is connected to temperature controller 241. In a particular embodiment, temperature controller 241 is a fan. However, in other embodiments, temperature controller 241 is implemented using other cooling devices. For example, temperature controller 241 can be a heat pipe which transports a cooling fluid in close proximity with integrated circuit 2. As the cooling fluid is routed past integrated circuit 2, the cooling fluid is vaporized. The resulting vapor is routed away from integrated circuit 2, thereby reducing the junction temperature of chip 201.

Thermally conductive lid 204 is connected to the upper surface (i.e., the back side) of flip chip 201 by a thermally conductive adhesive 209. Lid 204 can be formed of materials such as aluminum, copper, copper tungsten or copper molybdenum. In a particular embodiment, adhesive 209 is epoxy, silicone or polyimide filled with a thermally conductive material such as silver. Heat generated by chip 201 during normal operating conditions is transferred to lid 204 through adhesive 209. Heat sink connector 205 is located on the upper surface of lid 204, and heat sink 216 is located over connector 205 to further assist in the dissipation of heat generated by chip 201. Heat sink connector 205 and heat sink 216 are typically formed of a thermally conductive metal or alloy which includes, for example, aluminum or copper.

Lid 204 includes portions 204a and 204b which extend downward toward interconnect structure 210. An adhesive, having a composition similar to adhesive 209, is used to connect downward extending portions 204a and 204b of lid 204 to interconnect structure 210. Lid 204 and interconnect structure 210 thereby define a closed cavity 215 which completely encloses chip 201 and temperature sensing device 206.

System 200 operates as follows. Temperature control circuit 240 applies a substantially constant control voltage to temperature sensing device 206. In response, temperature sensing device 206 conducts a current which is dependent upon the resistance of temperature sensing device 206. The resistance of temperature sensing device 206 is proportional to the temperature of device 206, which in turn, is proportional to the temperature within enclosure 215. The temperature within enclosure 215 is proportional to the junction temperature of chip 201. Consequently, the current through temperature sensing device 206 is proportional to the junction temperature of chip 201. Temperature control circuit 240 measures the current through temperature sensing device 206 and calculates the junction temperature of chip 201 based on this current. When the calculated junction temperature exceeds a predetermined value, temperature control circuit 240 transmits a signal to temperature controller 241 which causes temperature controller 241 to either provide increased cooling or turn on (if temperature controller 241 was previously turned off).

Because temperature sensing device 206 is mounted on the same interconnect structure 210 as chip 201, and because temperature sensing device 206 is located within the same enclosure 215 as chip 201, the temperature of temperature sensing device 206 closely corresponds to the actual junction temperature of chip 201. Variations in the junction temperature of chip 201 are readily transferred to temperature sensing device 206 because of the proximity of these two elements 201, 206. As a result, the temperature information provided by temperature sensing device 206 to temperature control circuit 240 is more accurate than that previously provided by conventional electronic systems. This improved temperature information allows temperature control circuit 240 to control the operation of temperature controller 241 in an optimal manner known to one skilled in the art.

Although the invention has been described in connection with several embodiments, it is understood that this invention is not limited to the embodiments disclosed, but is capable of various modifications which would be apparent to one of ordinary skill in the art. For example, while integrated circuit 2 has been described in connection with a flip chip 201, it is understood that the present invention is equally applicable to other types of integrated circuits and other types of chips. In addition, although electronic system 200 is illustrated with a single integrated circuit 2 connected to printed circuit board 230, it is understood that additional integrated circuits are typically connected to printed circuit board 230. It is also understood that electronic system 200 can include multiple printed circuit boards, such as a motherboard (which supports a mounted central processing unit (CPU)) and/or other personal computer (PC) boards. Thus, the invention is limited only by the following claims.

What is claimed is:

1. An integrated circuit device comprising:
   and interconnect structure;
   a semiconductor chip which exhibits a junction temperature, the semiconductor ship being mounted on a first surface of the interconnect structure;
   a temperature sensing device mounted on the first surface of the interconnect structure, wherein the temperature which is proportional to the junction temperature of the semiconductor chip; and
   a thermally conductive lid connected to the interconnect structure, wherein the thermally conductive lid and the interconnect structure form a closed cavity which contains the semiconductor chip and the temperature sensing device, wherein the semiconductor chip is connected to the thermally conductive lid, and wherein the temperature sensing device is not connected to the thermally conductive lid and further wherein said first temperature is a temperature within said closed cavity.

2. The integrated circuit device of claim 1, further comprising a thermally conductive adhesive connecting the semiconductor chip to the thermally conductive lid.

3. The integrated circuit device of claim 1, further comprising a heat sink coupled to the thermally conductive lid.

4. The integrated circuit device of claim 1, further comprising:
   connector leads extending through the interconnect structure and connecting to the temperature sensing device, wherein the connector leads are adapted to connect the temperature sensing device to a cooling component which controls the junction temperature of the semiconductor chip.

5. The integrated circuit device of claim 4, wherein the connector leads comprise a pair of dedicated pins which extend through the interconnect structure.

6. The integrated circuit device of claim 4, wherein the connector leads extend to a second surface of the interconnect structure, the integrated circuit device further comprising an array of solder balls located at the second surface of the interconnect structure, wherein the connector leads are connected to corresponding solder balls of the array of solder balls.

7. The integrated circuit device of claim 4, wherein the cooling component comprises a fan.

8. The integrated circuit device of claim 4, wherein the cooling component comprises a heat pipe.

9. The integrated circuit device of claim 1, wherein the semiconductor chip is mounted in a flip chip configuration to the interconnect structure.

10. The integrated circuit device of claim 1, wherein the temperature sensing device comprises a thermistor.

11. The integrated circuit device of claim 1, wherein the temperature sensing device comprises a temperature sensitive diode.

12. An electronic system comprising:
    an interconnect structure;
    a semiconductor chip which exhibits a junction temperature, the semiconductor chip being mounted on a first surface of the interconnect structure;
    a temperature sensing device mounted on the first surface of the interconnect structure, wherein the temperature sensing device is mounted to directly sense a first temperature which is proportional to the junction temperature of the semiconductor chip;
    a thermally conductive lid connected to the interconnect structure,
        wherein the thermally conductive lid and the interconnect structure form a closed cavity which contains the semiconductor chip and the temperature sensing device;
        the semiconductor chip is connected to the thermally conductive lid;
        the temperature sensing device is not connected to the thermally conductive lid; and
        said first temperature is a temperature within said closed cavity; and
    a cooling component which controls the junction temperature of the semiconductor ship, the cooling component being connected to the temperature sensing device and being responsive to the first temperature.

13. The system of claim 12, wherein the cooling component comprises a fan.

14. The system of claim 12, wherein the cooling component comprises a heat pipe.

15. The system of claim 12, wherein the cooling component comprises;
    a control circuit coupled to the temperature sensing device, the control circuit being responsive to the first temperature; and
    a temperature controller coupled to the control circuit, wherein the temperature controller controls an ambient temperature around the semiconductor chip in response to the control circuit.

16. The system of claim 12, further comprising a plurality of connector leads extending through the interconnect structure, the connector leads connecting the temperature sensing device to the cooling component.

17. The system of claim 16, wherein the plurality of connector leads comprises a pair of dedicated pins which extend through the interconnect structure.

18. The system of claim 16, wherein the plurality of connector leads extend to a second surface of the interconnect structure, the system further comprising an array of solder balls located at the second surface of the interconnect structure, wherein the connector leads of the plurality of connector leads are connected to corresponding solder balls of the array of solder balls.

19. The system of claim 16, further comprising a printed circuit board, wherein the plurality of connector leads is coupled to the printed circuit board.

20. The system of claim 19, wherein the printed circuit board comprises a motherboard.

21. The system of claim 20, wherein the motherboard is contained in a computer.

22. A method of controlling the junction temperature of a semiconductor chip, the method comprising:

mounting the semiconductor chip on an interconnect structure;

mounting a temperature sensing device on the interconnect structure adjacent to the semiconductor chip;

mounting a thermally conductive lid on the interconnect structure, such that the thermally conductive thermally conductive lid and the interconnect structure form a closed cavity which surrounds the semiconductor chip and the temperature sensing device, wherein the semiconductor chip contacts the thermally conductive lid, and wherein the temperature sensing device does not contact the thermally conductive lid;

approximating the junction temperature of the semiconductor chip using the temperature sensing device wherein the temperature sensing device directly measures a temperature within said closed cavity; and cooling the semiconductor chip is response to the approximated junction temperature.

23. The method of claim 22, wherein said cooling the semiconductor chip further comprises increasing air flow around the thermally conductive lid.

* * * * *

UNITED STATES PATENT AND TRADEMARK OFFICE
CERTIFICATE OF CORRECTION

PATENT NO. : 5,831,333  
DATED : November 3, 1998  
INVENTOR(S) : Deviprasad Malladi, Douglas W. Forehand Page 1 of 1

It is certified that error appears in the above-identified patent and that said Letters Patent is hereby corrected as shown below:

Column 5, claim 1,  
Line 34, delete "and" and replace with -- an --;  
Line 36, delete "ship" and replace with -- chip --;  
Line 40, insert -- sensing device directly senses a first temperature -- before the word "which";

Column 6, claim 12,  
Line 43, delete "ship" and replace with -- chip --;

Column 6, claim 15,  
Line 51, delete ";" and replace with -- : --;

Signed and Sealed this

First Day of January, 2002

*Attest:*

JAMES E. ROGAN  
*Attesting Officer*    *Director of the United States Patent and Trademark Office*